United States Patent [19]
Hsu et al.

[11] Patent Number: 5,643,816
[45] Date of Patent: Jul. 1, 1997

[54] HIGH-DENSITY PROGRAMMABLE READ-ONLY MEMORY AND THE PROCESS FOR ITS FABRICATION

[75] Inventors: Chen-Chung Hsu, Taichung; Gary Hong, Hsinchu, both of Taiwan

[73] Assignee: United Microelectronics Corp., Hsingchu, Taiwan

[21] Appl. No.: 454,637

[22] Filed: May 31, 1995

[51] Int. Cl.⁶ .................................. H01L 21/265
[52] U.S. Cl. .................. 437/45; 437/48; 257/910; 257/390; 257/391
[58] Field of Search .................. 437/45, 48, 52; 257/390–391, 910

[56] References Cited

U.S. PATENT DOCUMENTS

| | | | |
|---|---|---|---|
| 4,502,208 | 3/1985 | McPherson | 437/52 |
| 5,480,823 | 1/1996 | Hsu | 437/48 |
| 5,510,288 | 4/1996 | Hong | 437/52 |

Primary Examiner—John Niebling
Assistant Examiner—Richard A. Booth
Attorney, Agent, or Firm—Ladas & Parry

[57] ABSTRACT

A read-only memory device having a memory array composed of memory cells formed as P-N junction diodes when programmed to be in an ON state and as blocking capacitors when remaining in an OFF state. A number of insulators are placed on the surface of a P-type substrate isolated from each other and aligned along one first defined direction. Each of a number of N-type bit lines is located on the P-type substrate between every neighboring pair of insulators. Each of a number of switch control layers is located on a corresponding one of the N-type bit lines. Each of a number of P-type word lines is located on the insulators along a direction that is substantially perpendicular to the first direction. A punch-through voltage is applied through the switch control layers at selected memory cell locations, thereby programming the memory cell at such locations to be in an ON state. All other memory cells locations keep their switch control layers intact and are thereby programmed to be in an OFF state.

5 Claims, 5 Drawing Sheets

200
HIGH-DENSITY PROGRAMMABLE READ-ONLY MEMORY AND THE PROCESS FOR ITS FABRICATION

BACKGROUND OF THE INVENTION

1. Field of the Invention

The present invention relates in general to a programmable read-only memory semiconductor device and the process for its fabrication. In particular, the present invention relates to a programmable read-only memory device having high memory cell density and its process of fabrication.

2. Technical Background

Read-only memory semiconductor devices, herein referred to as ROM devices, have been widely utilized in various types of digital equipment, ranging from mini-computer systems to microprocessor-based personal computer systems. ROM's are utilized to store programs or codes that are not to be altered under normal use conditions for these systems. The production of these ROM devices is normally designated by a customer, who supplies the code, or program, to be stored in the ROM device. In other words, the memory content of a particular ROM for a particular application is "programmed" at the factory which produces the ROM device.

The fabrication of a ROM IC is a relatively complicated process. Many of the fabrication steps take considerable time and involve special processing of the utilized material as well as requiring strict control of the processing environment. When manufacturing ROM IC devices of the same model, fabrication procedural steps are generally the same, the only differences between specific devices being in the memory contents to be programmed. The programing of the ROM memory content in the fabrication process of a ROM IC device is at the final stage of the entire process. Therefore, it is possible to manufacture a large quantity of a particular ROM IC device up to the stage of programming storage content, and then temporarily store such fabricated devices until the designation of the memory content. In this way, the production of code-containing ROM IC's may appear to a customer to be a fast process. A manufacturer has only to prepare the corresponding photomasks for the particular program content and execute the programming procedure.

Generally, the actual process of programming a ROM IC device to contain a designated code content involves implanting impurities of selected conductance type into selected memory cell transistors of the ROM IC. The selection of the memory cell transistor to be subjected to the ion implantation procedure corresponds to the code content when the ROM IC device is read accessed. The implanting of the impurities in the memory cells determines the read result of either an ON-state or an OFF-state of the memory cell transistor. The state of impurity implantation decides the ON-state or the OFF-state. The concentration of the impurity implantation is, however, a difficult process to control. An improper level of impurity concentration will affect the code contents in the form of binary 1's and 0's, and, in turn, the reliability of the ROM IC device. The process of "memory content implantation" involves the preparation of a photomask, which is a translated version of the code content that the ROM IC device is required to hold. In addition, all the programing procedures must be concluded before the ROM IC device can be packaged into its protective carrier.

Another alternative transistor-based ROM IC memory device programming methodology involves employing a switch layer integral to the ROM IC device such that micro-switches are formed using dielectric material. A dielectric micro-switch layer is fabricated to be in contact with the metal contact of each of the memory cells in the ROM IC device memory array, so as to control the ON and OFF status of the memory cell transistors. By selectively controlling the ON and OFF status of the micro-switches in the switch layer, the designated memory cells may be "programmed" to be in either the required ON or OFF status. For a more in-depth description of this programing concept, to which the present invention is related, refer to FIG. 1 of the accompanying drawing of the present invention.

FIG. 1 schematically shows in cross-sectional view a ROM semiconductor device fabricated in accordance with the prior art switch layer technique. The memory cell for the prior art ROM IC device includes semiconductor substrate 1, which in this depicted example is a P-type substrate, having the memory cell transistors fabricated thereon. Specifically, N-type drain 10, N-type source 12, as well as channel region 14 for the memory cell between source 12 and drain 10 are fabricated on P-type substrate 1.

The cell unit includes gate structure 102, having gate oxide layer 16 and gate electrode 18. Gate electrode 18 constitutes a word line in this memory cell. The cell unit also includes a layer of phosphosilicate glass 104 (PSG) which covers gate structure 102 and field oxide 100 and serves as an insulator. The cell unit further includes switch control layer 19, a dielectric material fabricated on top of N-type drain 10. Metal material is then formed over the surface of switch control layer 19 to constitute bit line 11, and is also formed over the surface of N-type source 12 to constitute ground line 13.

Referring to FIGS. 2a and 2b, equivalent circuits of the prior art ROM device memory cell in its OFF and programmed ON status, respectively, are shown. In FIG. 2a, the equivalent circuit of the memory cell indicates that the transistor comprising the core for the cell is tied to the memory array of the ROM device via both bit line 11 and word line 18.

The connection of the memory cell transistor to device bit line 11 is through an equivalent switch involving the dielectric switch control layer, and is expressed as the capacitor in the equivalent circuit of FIG. 2a. Dielectric switch control layer 19, when its region corresponding to the memory cell is maintained intact in its dielectric layer form, acts as a blocking capacitor between the source/drain of the transistor and bit line 11. When the dielectric layer at the region of the memory cell is punched through by an excessive electric potential applied thereon, the equivalent capacitor becomes a conducting switch that electrically connects the source/drain of the cell transistor to the bit line, thereby representing an ON transistor in the cell unit.

Thus, when a ROM IC device is not yet programmed to contain the code it is required to hold, each of its memory cells has its equivalent dielectric switch maintained at an equivalent OFF state, thereby turning off the cell transistor. FIG. 2a of the equivalent circuits represent this OFF status of the memory cell. When, however, a memory cell is required to be programmed, its equivalent capacitor is then punched through to become a conducting switch by the application of a programming voltage, and the memory cell becomes an equivalent circuit of FIG. 2b.

To fabricate switch control layer 19 and allow it to be made integral to the entire ROM IC device, a particular layer of photomasking must be prepared for the process. This photomasking preparation adds to the complexity of the fabrication procedure, as well as to the cost. Also, since the core of the memory cell of the ROM device is a transistor which requires a certain amount of die space, the usage of such transistors to form memory cell ON/OFF states constitutes an obstacle to device miniaturization.

SUMMARY OF THE INVENTION

It is therefore an object of the present invention to provide a programmable ROM IC device having a low-cost and simple fabrication process.

It is another object of the present invention to provide a programmable ROM IC device and fabrication process that has considerably higher memory cell density than the conventional art.

The present invention achieves the above-identified objects by providing a read-only memory (ROM) device having a memory array composed of memory cells which include P-N junction diodes when the memory cells are to be in an ON state and blocking capacitors when the memory cells are to be in an OFF state. In a preferred embodiment of the present invention a number of insulators are placed on the surface of a P-type substrate isolated from each other and aligned along one first defined direction. Each of a number of N-type bit lines is located on the P-type substrate between every neighboring pair of insulators. Each of a number of switch control layers is located on a corresponding one of the N-type bit lines. Each of a number of P-type word lines is located on the insulators along a direction that is substantially perpendicular to the first direction. A punch-through voltage is applied through the switch control layers at selected memory cell locations, thereby programming the memory cell at such locations to be in an ON state. All other memory cells locations keep their switch control layers intact and are thereby programmed to be in an OFF state.

Other objects, features and advantages of the present invention will become apparent by way of the following detailed description of the preferred but non-limiting embodiment.

BRIEF DESCRIPTION OF THE DRAWING

The detailed description set forth below is made with reference to the accompanying drawings, wherein.

DETAILED DESCRIPTION OF THE PREFERRED EMBODIMENTS

Figure 1:
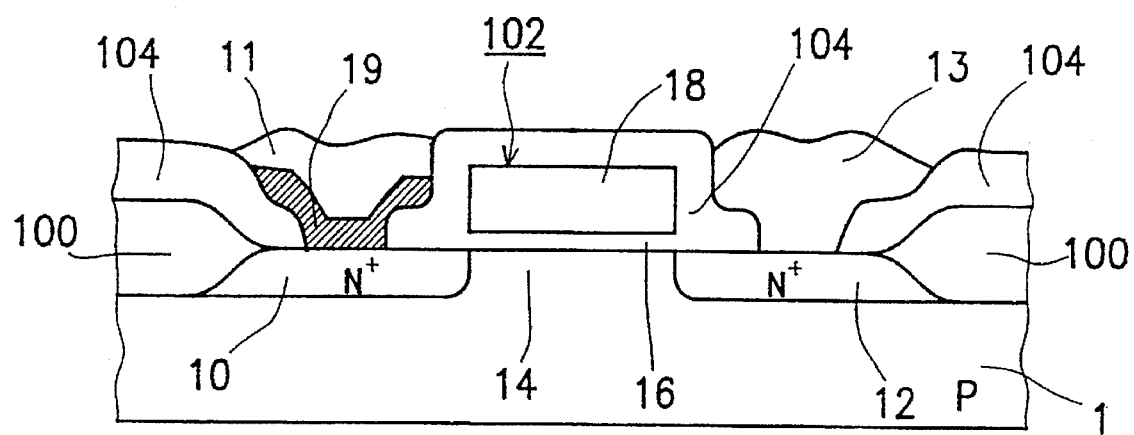
FIG. 1 schematically shows a cross-sectional view of the memory cell of a ROM semiconductor device fabricated in accordance with the prior art technique.
Figure 2A:
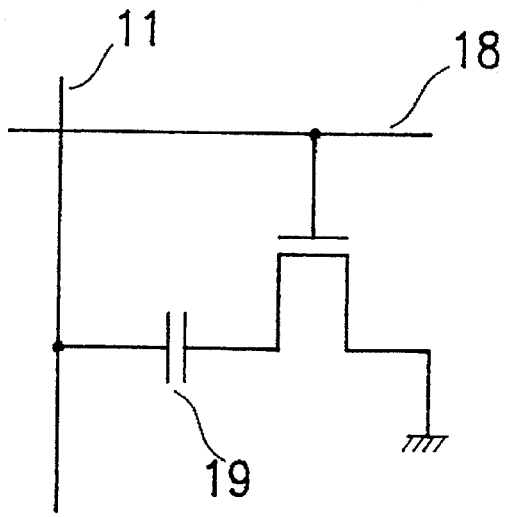
FIGS. 2a and 2b show the equivalent circuits of the prior art ROM device memory cell in its OFF and ON states respectively.
Figure 2B:
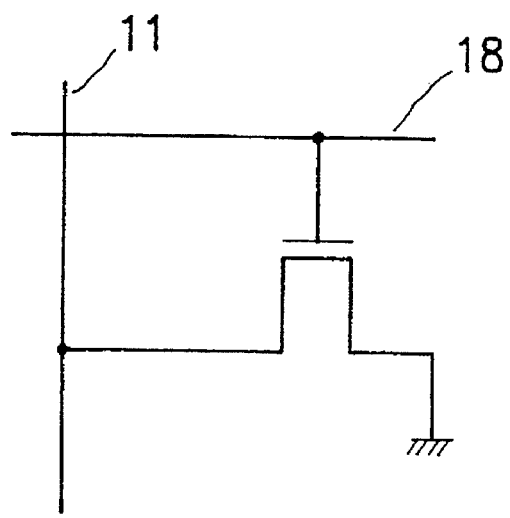
Figure 3A:
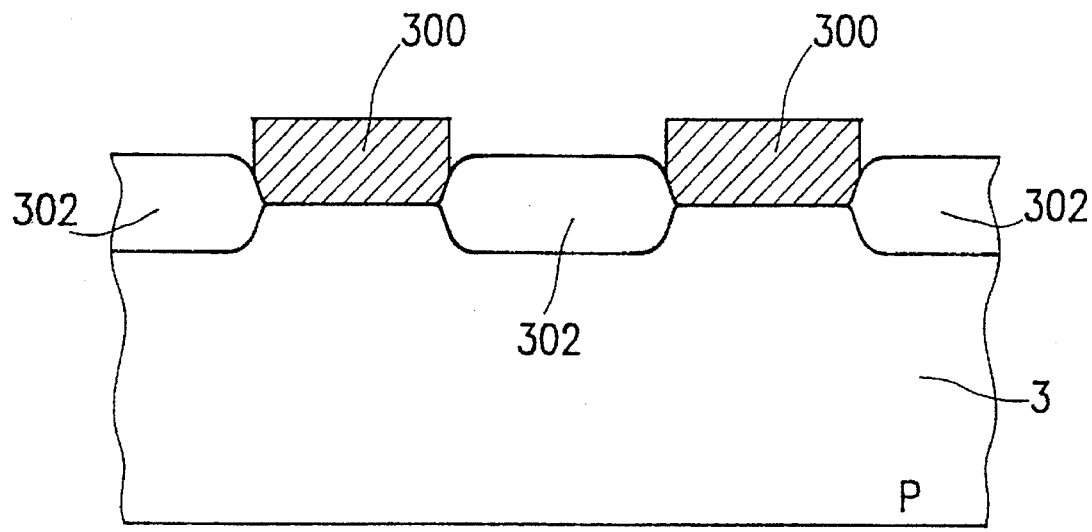
FIGS. 3a–3c schematically show cross-sectional views of the high-density ROM device memory cell fabricated in accordance with a preferred embodiment of the present invention as depicted at selected stages of its fabrication.
Figure 3B:
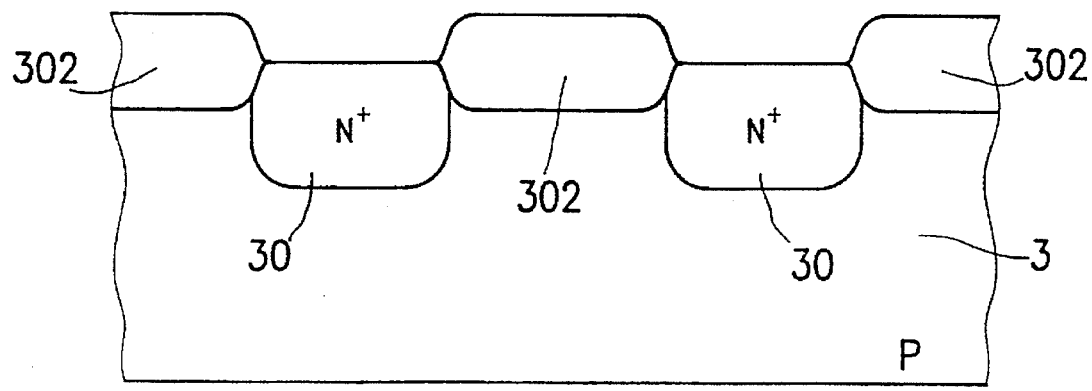
Figure 3C:
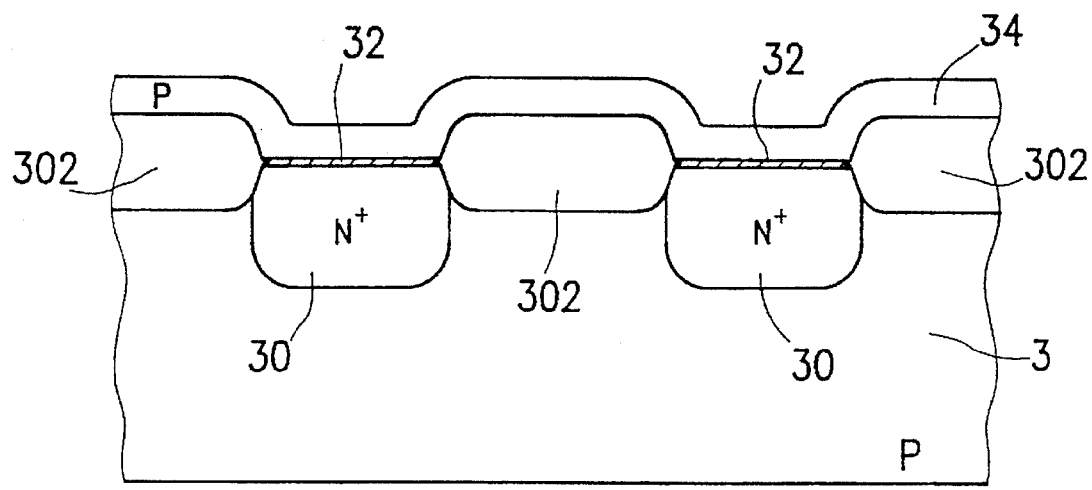

Referring to FIGS. 3a–3c, cross-sectional views of the high-density ROM device memory cell fabricated in accordance with a preferred embodiment of the present invention, as depicted during selected stages of its fabrication, are schematically shown. The present invention is suitable for fabrication of high density ROM IC devices on either a P- or N-type substrate, although, in the depicted embodiment of FIGS. 3a–3c, a P-type substrate 3 is used. The fabrication of the high-density ROM IC device of the present invention is described in the following process stages that exemplifies a preferred embodiment of the present invention.

Stage 1

As shown in FIG. 3a, shielding layer 300 of, for example, silicon nitride or pad oxide with silicon nitride thereabove, is first deposited over the surface of P-type substrate 3 and patterned thereon. Shielding layer 300 is formed and utilized to define the pattern for the bit line of the memory cell being fabricated. As is well known in the art, shielding layer 300 is developed to cover the designated pattern, and allows for the oxidation of the exposed portion of substrate 3 not being covered by shielding layer 300. The oxidized portions of P-type substrate 3 form field oxides 302 that also extend in bird-beak fashion slightly under the edges of shielding layers 300.

Stage 2

Referring next to FIG. 3b, shielding layer 300 is then removed, and field oxides 302 are subjected to a controlled etching procedure so that more of the surface area of P-type substrate 3 between field oxides 302 may be exposed. Field oxides 302 may then be utilized as shielding for the implementation of an ion implantation procedure. The ion implantation procedure implants impurities of N-type into the controlled depth of P-type substrate 3, forming bit lines 30 for the memory cell.

In the exemplified embodiment, the implanted N-type impurities may be arsenic ion, for example, at an implantation energy level of about 50 to 100 keV. The concentration of the implantation impurities is controlled in the range of between $1 \times 10^{15}$ to $5 \times 10^{15}$ atoms/cm$^2$.

Stage 3

Then, as is observed in FIG. 3c, the surface of bit line 30 is subjected to a process of oxidation, so as to form a layer of oxide with a thickness in the range of between 50Å to 100Å. This layer of oxidized bit line may also be utilized as switch control layer 32 for the memory cell that allows the memory cell unit to be maintained in an electrically OFF state, or when required, to be programmed to assume the ON state by the process to be described below.

After the formation of switch control layer 32, electrically conducting layer 34 of, for example, polysilicon, may then be deposited over the surface of P-type substrate 3 at this stage. Electrically conducting layer 34 may be further implanted with, for example, boron ions to improve its electrical conductivity. The boron ion implantation may be conducted at an energy level of about 30 to 100 keV, with an implantation concentration of between $1 \times 10^{15}$ to $1 \times 10^{16}$ atoms/cm$^2$. The purpose of the boron implantation is to form P-type electrically conducting layer 34, so that if switch control layer 32 at the corresponding location of the memory cell unit is programmed, or, in other words, punched through, by a programming voltage, a P-N junction may then be formed. Specifically, the produced P-N junction is formed between P-type conducting layer 34 and N-type bit line 30.

Another photomask layer (not shown) may then be prepared so as to define the pattern for word line 34 for the memory cell being fabricated. In particular, the photomasking is utilized as the shield for the implementation of an etching procedure. The exposed portions of electrically conducting layer 34 are subjected to a controlled etching process, forming word line 34 above the top surface of switch control layer 32 as well as field oxides 302.

Figure 4:
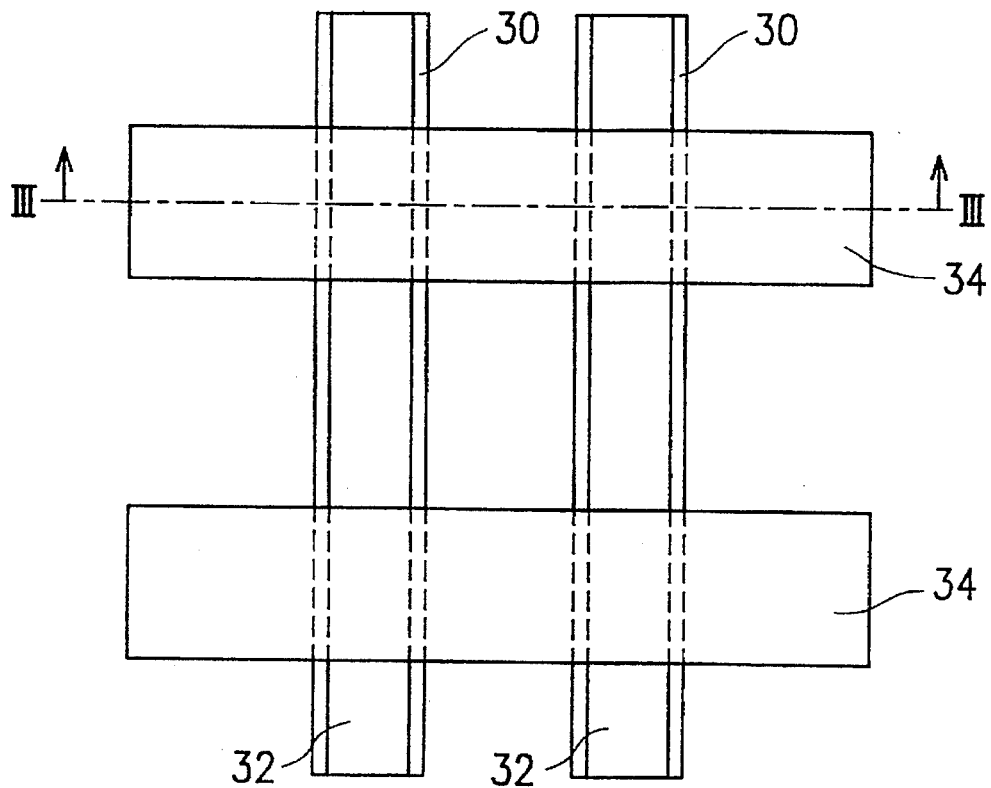
FIG. 4 schematically shows a top view of the memory cell of the high-density ROM device in accordance with the preferred embodiment of the present invention.

Essentially, word lines 34 thus formed substantially cross over bit lines 30 perpendicularly. For the purpose of more clearly showing the positional inter-relationship between the word and bit lines, a top view of the memory cell unit is shown in FIG. 4. Bit lines 30 are shown as vertical strips and word lines 34 are shown as horizontal strips. The cross-sectional view of FIGS. 3a–3c is taken along the III—III line as identified in FIG. 4.

At this stage, the process for fabricating a ROM IC device of the present invention having an entirely blank memory array may be considered to be complete. The following is a description of how the memory cells in the memory array of the ROM IC device of the present invention may be programmed to contain the required code bits.

Figures 5A, 5B:
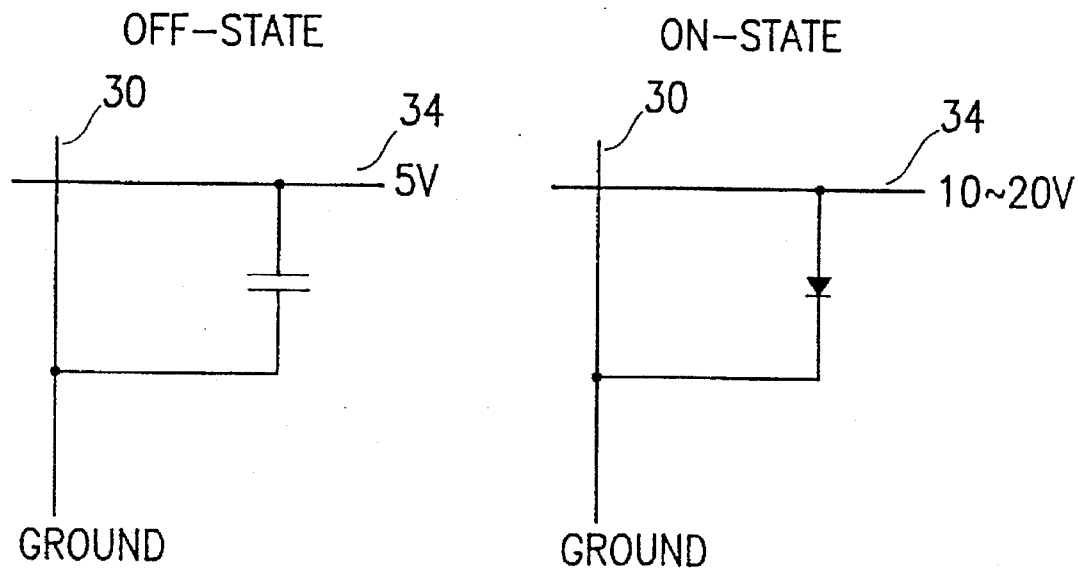
FIGS. 5a and 5b show respectively the equivalent circuits of the high-density ROM device in accordance with the preferred embodiment of the present invention.

Referring to FIGS. 5a and 5b, the equivalent circuits of the high-density ROM device in accordance with the preferred embodiment of the present invention are shown. The memory cell unit is in OFF state when a voltage of 5 V, which is in the range of normal ROM IC read access operations, is applied to the word line 34 of the cell, while the bit line 30 is tied to the ground electrical potential of the system. Switch control layer 32 lies between bit line 30 and word line 34. The inherent nature of the dielectric material that constitutes switch control layer 32 forms an equivalent blocking capacitor between bit line 30 and word line 34, and is shown as such in the equivalent circuit of FIG. 5a. When the applied electrical potential between 5 V-fed word line 34 and ground-tied bit line 30 is well under the breakdown field of switch control layer 32, the equivalent capacitor then acts as an OFF switch for the accessed memory cell.

On the other hand, when an electrical potential, say 10 to 20 volts, exceeding the breakdown field for the dielectric material that constitutes the switch control layer 32 is applied between the bit line 30 and the word line 34, then the equivalent capacitor becomes punchthrough causing the formation of a P-N junction device. Such is shown as a diode as in the equivalent circuit of FIG. 5b. As was described above, this P-N junction is formed between. P-type conducting layer 34 and N-type bit line 30.

With the application of the 5 V electrical potential to word line 34 with respect to the tie-to-ground bit line 30 which is a typical logic circuitry operating voltage, the P-N junction diode of FIG. 5b can be considered to be accessed, or read, as an ON memory cell unit.

Thus, by punching through switch control layer 32 at the locations corresponding to the selected memory cells of the present invention, these memory cells are equivalent to having been set to the ON state when accessed. All other memory cells with their switch control layer locations intact remain in the OFF state. This allows for the storage of program code bits as in the case of the conventional transistor-based memory cell units.

A review of the memory cell unit of the present invention, and, a comparison made between the memory cell unit of the present invention and the transistor-based memory cell of the conventional ROM IC devices, clearly shows that the present inventive memory cell configuration exhibits several advantages over the prior art memory cell units.

First of all, the use of a P-N junction diode in the present invention to replace the traditional field-effect transistor as the core element for a memory cell drastically reduces the die area required for a memory cell unit. This allows the ROM IC device of the present invention to integrate many more memory cells into the same space than can be achieved by the traditional bulky transistor-based memory cells.

Secondly, the fabrication procedure for the memory cells for the ROM IC device of the present invention can be greatly simplified when compared to that for conventional transistor-based memory devices.

Thirdly, the code programming procedure may be implemented either when the ROM IC device is still at the wafer stage, or after the device is packaged into the regular IC carrier as a finished ROM IC device. This allows for the flexibility in the ROM device manufacture for various customer requirements.

Figure 6:
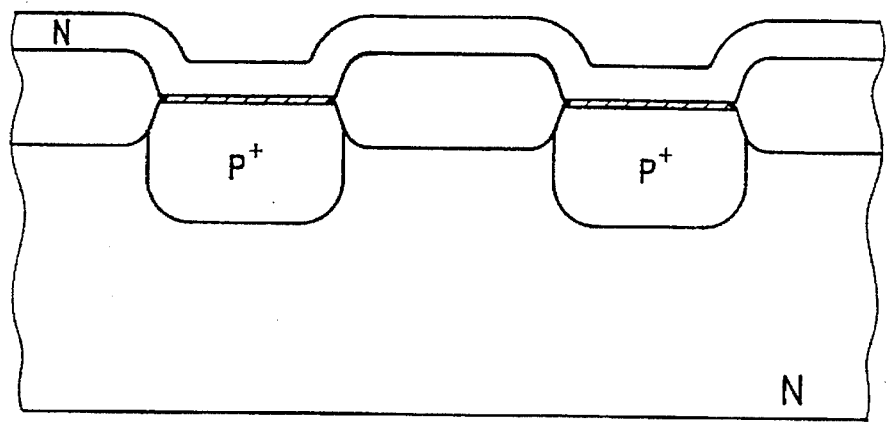
FIG. 6 schematically shows cross-sectional view of the high-density ROM device memory cell fabricated in accordance with another preferred embodiment of the present invention.
Figure 7A:
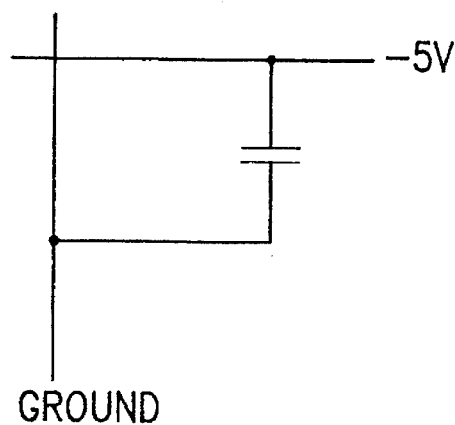
FIGS. 7a and 7b show respectively the equivalent circuits of the high-density ROM device in accordance with the another preferred embodiment depicted in FIG. 6.
Figure 7B:
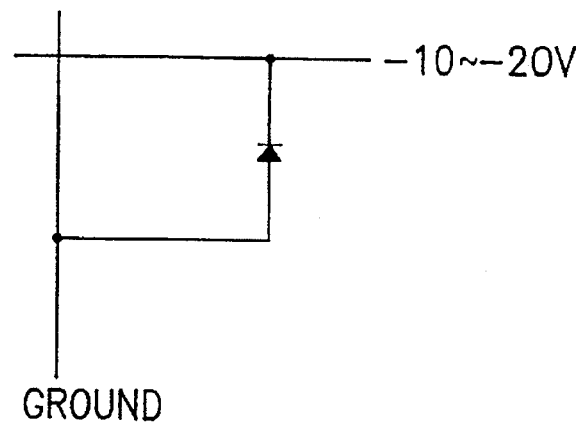

And, finally, both N- and P-type word line/bit line, as well as P- and N-type word line/bit line combinations may be employed for the construction of the memory cells of the present invention as shown in FIGS. 6, 7a and 7b. The only difference being the polarity of the required programing voltage for each of the two cases that is necessary for the punching through of the switch control layer for the programmed memory cells.

The above-described preferred embodiment of the present invention is utilized only for the purpose of the description of the present invention. Persons skilled in this art can appreciate the fact that other similar arrangements can be devised from the embodiment disclosed above without departing from the spirit of the present invention, which is recited in the following claims.

What is claimed is:

1. A process for fabricating semiconductor programmable read-only memory device for storing information of a first type and information of a second type, said programmable read-only memory device including a plurality of memory cells located on a substrate of a first conductivity type, said process comprising the steps of:

forming a plurality of insulators separated from each neighboring insulator along a first direction on a surface of said substrate of a first conductivity type;

implanting impurities of a second conductivity type into a depth of said substrate of a first conductivity type utilizing said plurality of insulators as shielding to form a corresponding plurality of separated implanted regions of the second conductivity type;

forming a corresponding plurality of dielectric switch control layers over each of said separated implanted regions of the second conductivity type;

forming a plurality of electrically conducting layers of the first conductivity type isolated from each neighboring other conductive layer of the first conductivity type along a second direction on said substrate of the first conductivity type, wherein said second direction is different from said first direction;

storing said information of a first type in any one of said plurality of memory cells by punching through one of said plurality of dielectric switch control layers that corresponds to said any memory cell by applying electrical potential through said one of said plurality of dielectric switch control layers, said electrical potential exceeding that of a punchthrough threshold of said one of said plurality of dielectric switch control layers; and storing said information of a second type in another one of said plurality of memory cells by maintaining integrity of one of said plurality of dielectric switch control layers that corresponds to said another one of said plurality of memory cells by applying electrical potential through said one of said plurality of dielectric switch control layers, said electrical potential being less than that of the punchthrough threshold of said one of said plurality of dielectric switch control layers.

2. The process for fabricating the semiconductor programmable read-only memory device of claim 1, wherein said first conductivity type is N-type and said second conductivity type is P-type.

3. The process for fabricating the semiconductor programmable read-only memory device of claim 1, wherein said first conductivity type is P-type and said second conductivity type is N-type.

4. The process for fabricating the semiconductor programmable read-only memory device of claim 1, wherein said insulators are field oxides.

5. The process for fabricating the semiconductor programmable read-only memory device of claim 1, wherein said dielectric switch control layers are oxide layers.

* * * * *